US012809431B2

(12) United States Patent
Liu et al.

(10) Patent No.: US 12,809,431 B2
(45) Date of Patent: Nov. 24, 2026

(54) LIDAR HEAT DISSIPATION STRUCTURE AND LIDAR

(71) Applicant: INNOVUSION (SUZHOU) CO., LTD., Suzhou (CN)

(72) Inventors: Guojun Liu, Suzhou (CN); Lirui Lu, Suzhou (CN); Siwei Luo, Suzhou (CN); Junwei Bao, Suzhou (CN)

(73) Assignee: INNOVUSION (SUZHOU) CO., LTD., Suzhou (CN)

( * ) Notice: Subject to any disclaimer, the term of this patent is extended or adjusted under 35 U.S.C. 154(b) by 246 days.

(21) Appl. No.: 18/713,155

(22) PCT Filed: Nov. 21, 2022

(86) PCT No.: PCT/IB2022/061197
§ 371 (c)(1),
(2) Date: May 23, 2024

(87) PCT Pub. No.: WO2023/094961
PCT Pub. Date: Jun. 1, 2023

(65) Prior Publication Data

US 2025/0004513 A1 Jan. 2, 2025

(30) Foreign Application Priority Data

Nov. 24, 2021 (CN) ......................... 202122891363.7

(51) Int. Cl.
*G06F 1/20* (2006.01)
*G01S 7/481* (2006.01)
*H05K 7/20* (2006.01)

(52) U.S. Cl.
CPC .............. *G06F 1/20* (2013.01); *G01S 7/4813* (2013.01); *H05K 7/20409* (2013.01); *H05K 7/20481* (2013.01)

(58) Field of Classification Search
CPC ... H10W 40/73; H10W 40/47; H10W 90/724; H10W 40/226; G06F 1/20;
(Continued)

(56) References Cited

U.S. PATENT DOCUMENTS

| | | |
|---|---|---|
| 3,897,150 A | 7/1975 | Bridges et al. |
| 4,464,048 A | 8/1984 | Farlow |

(Continued)

FOREIGN PATENT DOCUMENTS

| | | |
|---|---|---|
| CN | 1677050 A | 10/2005 |
| CN | 204758260 U | 11/2015 |

(Continued)

OTHER PUBLICATIONS

Hoffmeyer, M K, The Rework-able Radiator and Encapsulation Structure With High Performance and Its Manufacturing Method, CN1988138, PE2E search translation (Year: 2007).*

(Continued)

*Primary Examiner* — Michael A Matey
(74) *Attorney, Agent, or Firm* — MASCHOFF BRENNAN; Kenneth Han; Liang Huang

(57) ABSTRACT

The present utility model discloses a LiDAR heat dissipation structure and a LiDAR. The LiDAR comprises a mainboard, a chip, and a housing. The chip is provided on the mainboard. The heat dissipation structure comprises: a cold plate, the inner surface of the cold plate provided with a temperature equalization structure layer of multi-layer structure attached thereon and the outer surface of the cold plate facing away from the chip provided with a plurality of heat dissipation fins or heat dissipation slots formed thereon; and a heat pipe, fixedly embedded in the cold plate through a thermally conductive structural adhesive, wherein the cold plate couples with the housing to form a sealed cavity in which the mainboard and the chip are provided.

14 Claims, 1 Drawing Sheet

(58) Field of Classification Search

CPC .. G06F 2200/201; G06F 1/1656; G06F 1/181; G06F 1/182; H05K 7/20509; H05K 1/0209; H05K 7/20254; H05K 7/20336; H05K 7/20409; H05K 2201/064; H05K 7/20445; H05K 7/20854; H05K 7/20872; H05K 1/0272; H05K 2201/066; H05K 3/0061; H05K 7/20418; H05K 1/0203; H05K 7/20; H05K 7/2029; H05K 7/2039; H05K 7/205; H05K 7/20881; H05K 7/20936; H05K 7/2099; B60R 16/00; F28D 15/02; F28D 15/0275; F28D 15/0233; F21K 9/00; F21V 29/51; F21V 29/70; G01S 17/88; G01S 17/894; G01S 7/481; G02B 6/4269; G02B 6/4292

See application file for complete search history.

(56) References Cited

U.S. PATENT DOCUMENTS

| | | | | |
|---|---|---|---|---|
| 5,006,721 | A | 4/1991 | Cameron et al. | |
| 5,157,451 | A | 10/1992 | Taboada et al. | |
| 5,319,434 | A | 6/1994 | Croteau et al. | |
| 5,369,661 | A | 11/1994 | Yamaguchi et al. | |
| 5,442,358 | A | 8/1995 | Keeler et al. | |
| 5,546,188 | A | 8/1996 | Wangler et al. | |
| 5,579,153 | A | 11/1996 | Laming et al. | |
| 5,657,077 | A | 8/1997 | Deangelis et al. | |
| 5,793,491 | A | 8/1998 | Wangler et al. | |
| 5,838,239 | A | 11/1998 | Stern et al. | |
| 5,864,391 | A | 1/1999 | Hosokawa et al. | |
| 5,926,259 | A | 7/1999 | Bamberger et al. | |
| 5,936,756 | A | 8/1999 | Nakajima | |
| 6,163,378 | A | 12/2000 | Khoury | |
| 6,317,202 | B1 | 11/2001 | Hosokawa et al. | |
| 6,594,000 | B2 | 7/2003 | Green et al. | |
| 6,639,799 | B2 * | 10/2003 | Prasher | H10W 40/73 165/80.4 |
| 6,650,404 | B1 | 11/2003 | Crawford | |
| 6,950,733 | B2 | 9/2005 | Stopczynski | |
| 7,128,267 | B2 | 10/2006 | Reichenbach et al. | |
| 7,202,941 | B2 | 4/2007 | Munro | |
| 7,345,271 | B2 | 3/2008 | Boehlau et al. | |
| 7,440,084 | B2 | 10/2008 | Kane | |
| 7,440,175 | B2 | 10/2008 | Di et al. | |
| 7,489,865 | B2 | 2/2009 | Varshneya et al. | |
| 7,576,837 | B2 | 8/2009 | Liu et al. | |
| 7,830,527 | B2 | 11/2010 | Chen | |
| 7,835,068 | B1 | 11/2010 | Brooks et al. | |
| 7,847,235 | B2 | 12/2010 | Krupkin et al. | |
| 7,880,865 | B2 | 2/2011 | Tanaka et al. | |
| 7,936,448 | B2 | 5/2011 | Albuquerque et al. | |
| 7,969,558 | B2 | 6/2011 | Hall | |
| 7,982,861 | B2 | 7/2011 | Abshire et al. | |
| 8,072,582 | B2 | 12/2011 | Meneely | |
| 8,471,895 | B2 | 6/2013 | Banks | |
| 8,736,818 | B2 | 5/2014 | Weimer et al. | |
| 8,749,764 | B2 | 6/2014 | Hsu et al. | |
| 8,812,149 | B2 | 8/2014 | Doak | |
| 8,994,928 | B2 | 3/2015 | Shiraishi | |
| 9,048,616 | B1 | 6/2015 | Robinson | |
| 9,065,243 | B2 | 6/2015 | Asobe et al. | |
| 9,086,273 | B1 | 7/2015 | Gruver et al. | |
| 9,194,701 | B2 | 11/2015 | Thomas | |
| 9,255,790 | B2 | 2/2016 | Zhu | |
| 9,300,321 | B2 | 3/2016 | Zalik et al. | |
| 9,304,316 | B2 | 4/2016 | Weiss et al. | |
| 9,316,724 | B2 | 4/2016 | Gehring et al. | |
| 9,354,485 | B2 | 5/2016 | Fermann et al. | |
| 9,510,505 | B2 | 12/2016 | Halloran et al. | |
| 9,575,184 | B2 | 2/2017 | Gilliland et al. | |
| 9,605,998 | B2 | 3/2017 | Nozawa | |
| 9,621,876 | B2 | 4/2017 | Federspiel | |
| 9,638,799 | B2 | 5/2017 | Goodwin et al. | |
| 9,696,426 | B2 | 7/2017 | Zuk et al. | |
| 9,702,966 | B2 | 7/2017 | Batcheller et al. | |
| 9,804,264 | B2 | 10/2017 | Mlleneuve et al. | |
| 9,810,786 | B1 | 11/2017 | Welford et al. | |
| 9,812,374 | B1 * | 11/2017 | Refai-Ahmed | H10W 40/22 |
| 9,812,838 | B2 | 11/2017 | Mlleneuve et al. | |
| 9,823,353 | B2 | 11/2017 | Eichenholz et al. | |
| 9,857,468 | B1 | 1/2018 | Eichenholz et al. | |
| 9,869,754 | B1 | 1/2018 | Campbell et al. | |
| 9,880,263 | B2 | 1/2018 | Droz et al. | |
| 9,880,278 | B2 | 1/2018 | Van et al. | |
| 9,885,778 | B2 | 2/2018 | Dussan | |
| 9,897,689 | B2 | 2/2018 | Dussan | |
| 9,915,726 | B2 | 3/2018 | Bailey et al. | |
| 9,927,915 | B2 | 3/2018 | Frame et al. | |
| 9,958,545 | B2 | 5/2018 | Eichenholz et al. | |
| 10,007,001 | B1 | 6/2018 | Lachapelle et al. | |
| 10,012,732 | B2 | 7/2018 | Eichenholz et al. | |
| 10,042,159 | B2 | 8/2018 | Dussan et al. | |
| 10,061,019 | B1 | 8/2018 | Campbell et al. | |
| 10,073,166 | B2 | 9/2018 | Dussan | |
| 10,078,133 | B2 | 9/2018 | Dussan | |
| 10,094,925 | B1 | 10/2018 | Lachapelle | |
| 10,157,630 | B2 | 12/2018 | Vaughn et al. | |
| 10,191,155 | B2 | 1/2019 | Curatu | |
| 10,215,847 | B2 | 2/2019 | Scheim et al. | |
| 10,267,898 | B2 | 4/2019 | Campbell et al. | |
| 10,295,656 | B1 | 5/2019 | Li et al. | |
| 10,310,058 | B1 | 6/2019 | Campbell et al. | |
| 10,324,170 | B1 | 6/2019 | Engberg et al. | |
| 10,324,185 | B2 | 6/2019 | Mcwhirter et al. | |
| 10,393,877 | B2 | 8/2019 | Hall et al. | |
| 10,429,495 | B1 | 10/2019 | Wang et al. | |
| 10,444,356 | B2 | 10/2019 | Wu et al. | |
| 10,451,716 | B2 | 10/2019 | Hughes et al. | |
| 10,466,342 | B1 | 11/2019 | Zhu et al. | |
| 10,502,831 | B2 | 12/2019 | Eichenholz | |
| 10,509,112 | B1 | 12/2019 | Pan | |
| 10,520,602 | B2 | 12/2019 | Mlleneuve et al. | |
| 10,557,923 | B2 | 2/2020 | Watnik et al. | |
| 10,571,567 | B2 | 2/2020 | Campbell et al. | |
| 10,578,720 | B2 | 3/2020 | Hughes et al. | |
| 10,591,600 | B2 | 3/2020 | Mlleneuve et al. | |
| 10,627,491 | B2 | 4/2020 | Hall et al. | |
| 10,641,872 | B2 | 5/2020 | Dussan et al. | |
| 10,663,564 | B2 | 5/2020 | Lachapelle | |
| 10,663,585 | B2 | 5/2020 | Mcwhirter | |
| 10,663,596 | B2 | 5/2020 | Dussan et al. | |
| 10,684,360 | B2 | 6/2020 | Campbell | |
| 10,908,262 | B2 | 2/2021 | Dussan | |
| 10,908,265 | B2 | 2/2021 | Dussan | |
| 10,908,268 | B2 | 2/2021 | Zhou et al. | |
| 10,969,475 | B2 | 4/2021 | Li et al. | |
| 10,983,218 | B2 | 4/2021 | Hall et al. | |
| 11,002,835 | B2 | 5/2021 | Pan et al. | |
| 11,009,605 | B2 | 5/2021 | Li et al. | |
| 11,175,405 | B2 | 11/2021 | Pacala et al. | |
| 11,178,381 | B2 | 11/2021 | Pacala et al. | |
| 11,190,750 | B2 | 11/2021 | Pacala et al. | |
| 11,194,048 | B1 | 12/2021 | Burbank et al. | |
| 11,287,515 | B2 | 3/2022 | Pacala et al. | |
| 11,422,236 | B2 | 8/2022 | Pacala et al. | |
| 11,605,886 | B1 * | 3/2023 | Refai-Ahmed | H01Q 1/02 |
| 2002/0136251 | A1 | 9/2002 | Green et al. | |
| 2004/0042178 | A1 * | 3/2004 | Gektin | H10W 40/70 257/E23.09 |
| 2004/0135992 | A1 | 7/2004 | Munro | |
| 2004/0261988 | A1 * | 12/2004 | Sauciuc | F28D 15/02 165/185 |
| 2005/0033497 | A1 | 2/2005 | Stopczynski | |
| 2005/0190424 | A1 | 9/2005 | Reichenbach et al. | |
| 2005/0195383 | A1 | 9/2005 | Breed et al. | |
| 2006/0071846 | A1 | 4/2006 | Yanagisawa et al. | |
| 2006/0132752 | A1 | 6/2006 | Kane | |
| 2007/0091948 | A1 | 4/2007 | Di et al. | |
| 2007/0216995 | A1 | 9/2007 | Bollond et al. | |
| 2008/0174762 | A1 | 7/2008 | Liu et al. | |
| 2008/0193135 | A1 | 8/2008 | Du et al. | |
| 2009/0010644 | A1 | 1/2009 | Varshneya et al. | |

(56) References Cited

U.S. PATENT DOCUMENTS

2009/0051926 A1 2/2009 Chen
2009/0059201 A1 3/2009 Willner et al.
2009/0067453 A1 3/2009 Mizuuchi et al.
2009/0147239 A1 6/2009 Zhu et al.
2009/0262760 A1 10/2009 Krupkin et al.
2009/0316134 A1 12/2009 Michael et al.
2010/0006760 A1 1/2010 Lee et al.
2010/0020306 A1 1/2010 Hall
2010/0020377 A1 1/2010 Borchers et al.
2010/0027602 A1 2/2010 Abshire et al.
2010/0045965 A1 2/2010 Meneely
2010/0053715 A1 3/2010 O'Neill et al.
2010/0128109 A1 5/2010 Banks
2010/0271614 A1 10/2010 Albuquerque et al.
2011/0181864 A1 7/2011 Schmitt et al.
2012/0038903 A1 2/2012 Weimer et al.
2012/0124113 A1 5/2012 Zalik et al.
2012/0221142 A1 8/2012 Doak
2013/0107016 A1 5/2013 Federspiel
2013/0116971 A1 5/2013 Retkowski et al.
2013/0241761 A1 9/2013 Cooper et al.
2013/0258599 A1* 10/2013 Danello ................ H10W 40/77 361/706
2013/0293867 A1 11/2013 Hsu et al.
2013/0293946 A1 11/2013 Fermann et al.
2013/0329279 A1 12/2013 Nati et al.
2013/0342822 A1 12/2013 Shiraishi
2014/0078514 A1 3/2014 Zhu
2014/0104594 A1 4/2014 Gammenthaler
2014/0347650 A1 11/2014 Bösch
2014/0350836 A1 11/2014 Stettner et al.
2015/0078123 A1 3/2015 Batcheller et al.
2015/0084805 A1 3/2015 Dawber
2015/0109603 A1 4/2015 Kim et al.
2015/0116692 A1 4/2015 Zuk et al.
2015/0139259 A1 5/2015 Robinson
2015/0158489 A1 6/2015 Oh et al.
2015/0338270 A1 11/2015 Williams et al.
2015/0355327 A1 12/2015 Goodwin et al.
2016/0003946 A1 1/2016 Gilliland et al.
2016/0047896 A1 2/2016 Dussan
2016/0047900 A1 2/2016 Dussan
2016/0061655 A1 3/2016 Nozawa
2016/0061935 A1 3/2016 Mccloskey et al.
2016/0100521 A1 4/2016 Halloran et al.
2016/0117048 A1 4/2016 Frame et al.
2016/0172819 A1 6/2016 Ogaki
2016/0178736 A1 6/2016 Chung
2016/0226210 A1 8/2016 Zayhowski et al.
2016/0245902 A1 8/2016 Watnik et al.
2016/0291134 A1 10/2016 Droz et al.
2016/0313445 A1 10/2016 Bailey et al.
2016/0327646 A1 11/2016 Scheim et al.
2017/0003116 A1 1/2017 Yee et al.
2017/0153319 A1 6/2017 Villeneuve et al.
2017/0242104 A1 8/2017 Dussan
2017/0299721 A1 10/2017 Eichenholz et al.
2017/0307738 A1 10/2017 Schwarz et al.
2017/0365105 A1 12/2017 Rao et al.
2018/0040171 A1 2/2018 Kundu et al.
2018/0050704 A1 2/2018 Tascione et al.
2018/0069367 A1 3/2018 Villeneuve et al.
2018/0152691 A1 5/2018 Pacala et al.
2018/0156896 A1 6/2018 O'Keeffe
2018/0158471 A1 6/2018 Vaughn et al.
2018/0164439 A1 6/2018 Droz et al.
2018/0188355 A1 7/2018 Bao et al.
2018/0188357 A1 7/2018 Li et al.
2018/0188358 A1 7/2018 Li et al.
2018/0188371 A1 7/2018 Bao et al.
2018/0210084 A1 7/2018 Zwölfer et al.
2018/0275274 A1 9/2018 Bao et al.
2018/0284241 A1 10/2018 Campbell et al.
2018/0284242 A1 10/2018 Campbell
2018/0284286 A1 10/2018 Eichenholz et al.
2018/0329060 A1 11/2018 Pacala et al.
2018/0359460 A1 12/2018 Pacala et al.
2019/0025428 A1 1/2019 Li et al.
2019/0041922 A1* 2/2019 Kurma Raju ........ H05K 7/2039
2019/0107607 A1 4/2019 Danziger
2019/0107623 A1 4/2019 Campbell et al.
2019/0120942 A1 4/2019 Zhang et al.
2019/0120962 A1 4/2019 Gimpel et al.
2019/0154804 A1 5/2019 Eichenholz
2019/0154807 A1 5/2019 Steinkogler et al.
2019/0212416 A1 7/2019 Li et al.
2019/0250254 A1 8/2019 Campbell et al.
2019/0257924 A1 8/2019 Li et al.
2019/0265334 A1 8/2019 Zhang et al.
2019/0265336 A1 8/2019 Zhang et al.
2019/0265337 A1 8/2019 Zhang et al.
2019/0265339 A1 8/2019 Zhang et al.
2019/0277952 A1 9/2019 Beuschel et al.
2019/0310368 A1 10/2019 Lachapelle
2019/0369215 A1 12/2019 Wang et al.
2019/0369258 A1 12/2019 Hall et al.
2019/0383915 A1 12/2019 Li et al.
2020/0142070 A1 5/2020 Hall et al.
2020/0256964 A1 8/2020 Campbell et al.
2020/0284906 A1 9/2020 Eichenholz et al.
2020/0319310 A1 10/2020 Hall et al.
2020/0400798 A1 12/2020 Rezk et al.
2021/0011534 A1* 1/2021 Yin .................... H05K 7/20863
2021/0028088 A1* 1/2021 Brandenburg ........ H10W 40/73
2021/0088630 A9 3/2021 Zhang
2021/0349507 A1* 11/2021 Cao .................... H05K 7/20254
2022/0264741 A1* 8/2022 Damaraju ............... G01S 7/027

FOREIGN PATENT DOCUMENTS

CN 204885804 U 12/2015
CN 108089201 A 5/2018
CN 108132472 A 6/2018
CN 207457508 U 6/2018
CN 207557465 U 6/2018
CN 108445468 A 8/2018
CN 109116331 A 1/2019
CN 109116366 A 1/2019
CN 109116367 A 1/2019
CN 109188397 A 1/2019
CN 208314210 U 1/2019
CN 208421228 U 1/2019
CN 208705506 U 4/2019
CN 106597471 B 5/2019
CN 109725320 A 5/2019
CN 109814082 A 5/2019
CN 109814086 A 5/2019
CN 109917348 A 6/2019
CN 109917408 A 6/2019
CN 109950784 A 6/2019
CN 110031822 A 7/2019
CN 110031823 A 7/2019
CN 209280923 U 8/2019
CN 110492349 A 11/2019
CN 110492856 A 11/2019
CN 110736975 A 1/2020
CN 110780283 A 2/2020
CN 110780284 A 2/2020
CN 110784220 A 2/2020
CN 108594206 B 4/2020
CN 211655309 U 10/2020
CN 212574798 U 2/2021
CN 212623082 U 2/2021
CN 112578396 A 3/2021
CN 212649970 U 3/2021
CN 112639527 A 4/2021
CN 213182011 U 5/2021
CN 213750313 U 7/2021
CN 214151038 U 9/2021
CN 113491043 A 10/2021
CN 214795200 U 11/2021
CN 214795206 U 11/2021
CN 214895784 U 11/2021
CN 214895810 U 11/2021

(56) References Cited

FOREIGN PATENT DOCUMENTS

| | | | |
|---|---|---|---|
| CN | 215641806 | U | 1/2022 |
| CN | 215932142 | U | 3/2022 |
| CN | 115267727 | A | 11/2022 |
| CN | 223296134 | U | 9/2025 |
| EP | 0757257 | A2 | 2/1997 |
| EP | 1237305 | A2 | 9/2002 |
| EP | 1923721 | A1 | 5/2008 |
| EP | 2157445 | A2 | 2/2010 |
| EP | 2395368 | A1 | 12/2011 |
| EP | 2889642 | A1 | 7/2015 |
| GB | 1427164 | A | 3/1976 |
| GB | 2000411 | A | 1/1979 |
| JP | 2007-144667 | A | 6/2007 |
| JP | 2010-035385 | A | 2/2010 |
| JP | 2017-003347 | A | 1/2017 |
| JP | 2017-138301 | A | 8/2017 |
| KR | 10-2012-0013515 | A | 2/2012 |
| KR | 10-2013-0068224 | A | 6/2013 |
| KR | 10-2018-0107673 | A | 10/2018 |
| WO | 2017/110417 | A1 | 6/2017 |
| WO | 2018/125725 | A1 | 7/2018 |
| WO | 2018/129408 | A1 | 7/2018 |
| WO | 2018/129409 | A1 | 7/2018 |
| WO | 2018/129410 | A1 | 7/2018 |
| WO | 2018/175990 | A1 | 9/2018 |
| WO | 2018/182812 | A2 | 10/2018 |
| WO | 2019/079642 | A1 | 4/2019 |
| WO | 2019/165095 | A1 | 8/2019 |
| WO | 2019/165289 | A1 | 8/2019 |
| WO | 2019/165294 | A1 | 8/2019 |
| WO | 2020/013890 | A2 | 1/2020 |

OTHER PUBLICATIONS

Peng, Yaofeng, Heat Dissipation Assembly and Automobile, WO-2022042092-A1, PE2E search translation (Year: 2022).*

Chen, X, et al. (Feb. 2010). "Polarization Coupling of Light and Optoelectronics Devices Based on Periodically Poled Lithium Niobate," Shanghai Jiao Tong University, China, Frontiers in Guided Wave Optics and Optoelectronics, 24 pages.

European Search Report, dated Jul. 17, 2020, for EP Application No. 18776977.3, 12 pages.

European Search Report, dated Jun. 17, 2021, for EP Application No. 18868896.4, 7 pages.

Extended European Search Report, dated Jul. 10, 2020, for EP Application No. 18736738.8, 9 pages.

Extended European Search Report, dated Jul. 22, 2020, for EP Application No. 18736685.1, 10 pages.

Fiber laser, Wikipedia, https://en.wikipedia.org/wiki/Fiber_laser, 6 pages.

Gluckman, J. (May 13, 2016). "Design of the processing chain for a high-altitude, airborne, single-photon lidar mapping instrument," Proceedings of SPIE; [Proceedings of SPIE ISSN 0277-786X vol. 10524], SPIE, US, vol. 9832, 9 pages.

Goldstein, R. (Apr. 1986) "Electro-Optic Devices in Review, The Linear Electro-Optic (Pockels) Effect Forms the Basis for a Family of Active Devices," Laser & Applications, FastPulse Technology, Inc., 6 pages.

Gunzung, Kim, et al. (Mar. 2, 2016). "A hybrid 3D LIDAR imager based on pixel-by-pixel scanning and DS-OCDMA," pages Proceedings of SPIE [Proceedings of SPIE ISSN 0277-786X vol. 10524], SPIE, US, vol. 9751, pp. 975119-975119-8.

International Preliminary Report on Patentability, dated Apr. 30, 2020, for International Application No. PCT/US2018/056577, 8 pages.

International Preliminary Report on Patentability, dated Jul. 9, 2019, for International Application No. PCT/US2018/012704, 7 pages.

International Preliminary Report on Patentability, dated Jul. 9, 2019, for International Application No. PCT/US2018/012703, 10 pages.

International Preliminary Report on Patentability, dated Jul. 9, 2019, for International Application No. PCT/US2018/012705, 7 pages.

International Search Report and Written Opinion received for PCT Patent Application No. PCT/IB2022/061197, mailed on Feb. 10, 2023, 12 pages.

International Search Report and Written Opinion, dated Jan. 17, 2020, for International Application No. PCT/US2019/019276, 14 pages.

International Search Report and Written Opinion, dated Jan. 3, 2019, for International Application No. PCT/US2018/056577, 15 pages.

International Search Report and Written Opinion, dated Jul. 9, 2019, for International Application No. PCT/US2019/018987, 17 pages.

International Search Report and Written Opinion, dated Jun. 7, 2018, for International Application No. PCT/US2018/024185, 9 pages.

International Search Report and Written Opinion, dated Mar. 19, 2018, for International Application No. PCT/US2018/012705, 12 pages.

International Search Report and Written Opinion, dated Mar. 20, 2018, for International Application No. PCT/US2018/012703, 13 pages.

International Search Report and Written Opinion, dated Mar. 23, 2018, for International Application No. PCT/US2018/012704, 12 pages.

International Search Report and Written Opinion, dated May 3, 2019, for International Application No. PCT/US2019/019272, 16 pages.

International Search Report and Written Opinion, dated May 6, 2019, for International Application No. PCT/US2019/019264, 15 pages.

International Search Report and Written Opinion, dated Sep. 18, 2018, for International Application No. PCT/US2018/012116, 12 pages.

Mirrors, Physics LibreTexts, https://phys.libretexts.org/Bookshelves/Optics/Supplemental_Modules_(Components)/Mirrors, (2021), 2 pages.

Office Action Issued in Japanese Patent Application No. 2019-536019 dated Nov. 30, 2021, 6 pages.

Why Wavelengths Matter in Fiber Optics, FirstLight, https://www.firstlight.net/why-wavelengths-matter-in-fiber-optics/, (2021), 5 pages.

* cited by examiner

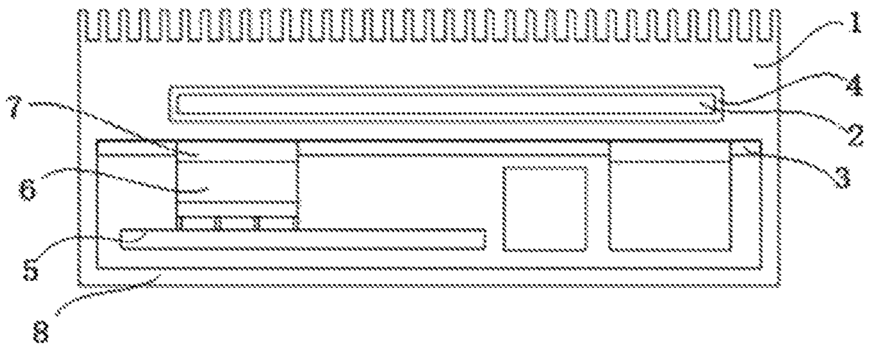
1
4
2
3
7
6
5
8

LIDAR HEAT DISSIPATION STRUCTURE AND LIDAR

CROSS REFERENCE TO RELATED APPLICATIONS

This application is a U.S. National Phase application under 35 U.S.C. § 371 of International Application No. PCT/IB2022/061197, filed on Nov. 21, 2022, which claims priority to Chinese Patent Application No. 202122891363.7, filed Nov. 24, 2021, entitled "A HEAT DISSIPATION STRUCTURE FOR LIDAR AND LIDAR." The contents of both applications are incorporated by reference in their entireties for all purposes.

TECHNICAL FIELD

The present utility model relates to the technical field of LiDAR heat dissipation, and in particular to a LiDAR heat dissipation structure and a LiDAR having the heat dissipation structure.

BACKGROUND

LiDAR (Light Detection and Ranging) is a radar system that emits a laser beam to detect characteristic quantity, such as position and speed, of a target. Its working principle is to transmit a detection signal (a laser beam) to a target, compare the received signal (target echo) reflected from the target to the transmitted signal, and obtain the relevant information of the target with proper processing, such as target distance, orientation, height, speed, attitude, and even shape and other parameters, so as to detect, track and identify the target.

LiDAR integrates a large number of optical, electronic and mechanical components inside, and belongs to opto-mechatronics sensing equipment with high integration and high power density. The United States once analyzed the failures of airborne electronic equipment throughout the year and found that the reasons for the failures are as follows: more than 50% of the failures are caused by all kinds of environmental factors, and 43.58% of the failures of the electronic devices are caused by three environmental factors of temperature, vibration and humidity, in which 22.2% of the failures caused by temperature. The same is true for LiDARs, where temperature is the main potential cause.

Therefore, the quality of the heat dissipation of the LiDAR directly affects the service life and reliability of the LiDAR. In the prior art, the heat dissipation methods of a LiDAR generally include natural heat dissipation and active heat dissipation. The active heat dissipation further includes air-cooling heat dissipation and liquid-cooling heat dissipation. For the air-cooling heat dissipation, additional fans and ventilation holes are necessary which occupy a lot of the limited internal space of the LiDAR, and the fan is prone to vibration during operation and thus generates noise. In addition, since the heat concentration problems of the electronic components inside the LiDAR are usually regional heat concentration and overheat at a certain point, etc., which cannot be solved by the existing heat dissipation methods, it is difficult to effectively ensure that the LiDAR can operate reliably under different working conditions. Although there are solutions to the problem of heat concentration in the prior art, such as making the entire cold plate into a vacuum chamber and rapidly uniformizing the temperature through gas-liquid phase transition, this solution is complicated in process and high in cost. For the problem of overheat at a certain point, although TEC semiconductor heat dissipation is used to solve the problem in the prior art, this solution also has the problem of high cost, and has the additional problems of reliability and additional heat generation, etc. Since the LiDAR is usually installed in a closed space for waterproof and dustproof requirements, the heat dissipation housing of the equipment cannot be in direct contact with the natural air such that the heat transferred from the inside of the LiDAR to the housing cannot be smoothly transferred to the atmosphere. Therefore, the heat dissipation condition is more severe than the conventional natural heat dissipation, and a stronger natural heat dissipation capacity is required.

SUMMARY

In view of the above-mentioned technical problem, the objective of the present utility model is to provide a LiDAR heat dissipation structure and a LiDAR, which solve the problem to be further optimized and improved that the existing LiDARs use active heat dissipation resulting in complicated structures, high cost, large space occupation and poor heat dissipation capacity.

The technical solutions of the present utility model are as follows.

One objective of the present utility model is to provide a LiDAR heat dissipation structure comprising a mainboard, a chip and a housing, the chip is provided on the mainboard, and the heat dissipation structure comprises:

- a cold plate, the inner surface of the cold plate provided with a temperature equalization structure layer of multi-layer structure attached thereon, and the outer surface of the cold plate facing away from the chip provided with a plurality of heat dissipation fins or heat dissipation slots formed thereon; and
- a heat pipe, fixedly embedded in the cold plate through a thermally conductive structural adhesive, wherein
- the cold plate couples with the housing to form a sealed cavity in which the mainboard and the chip are provided.

Optionally, a recessed embedded portion is provided on a side surface of the cold plate, a gap is formed between an inner wall of the embedded portion and the heat pipe, and the gap is used to be filled with the thermally conductive structural adhesive.

Optionally, the embedded portion is a groove extending along the longitudinal direction of the cold plate, and the depth of the groove is not greater than the thickness of the side wall of the cold plate.

Optionally, a cover plate is provided at the opening of the embedded portion for covering the heat pipe.

Optionally, the temperature equalization structure layer is a graphite layer.

Optionally, the graphite layer is formed by stacking multiple layers of graphite sheets.

Optionally, the housing is made of semi-solid die-cast aluminum alloy.

Optionally, a thermally conductive interface material layer is provided between the chip and the inner surface of the cold plate.

Another objective of the present utility model is to provide a LiDAR comprising the LiDAR heat dissipation structure according to any aspect as described above.

Compared with the prior art, the present utility model has the following advantages:

the LiDAR heat dissipation structure of the present utility model achieves the regional temperature uniformity in a large area through the temperature equalization structure layer and alleviates the problem of overheat at a certain point through the heat pipe fixedly embedded in the cold plate, thereby solving the problem of heat concentration without occupying excessive space. The heat dissipation structure has good heat dissipation performance and ensures that the LiDAR works reliably under different working conditions.

BRIEF DESCRIPTION OF THE DRAWINGS

The present utility model will be further described below with reference to the accompanying drawings and the embodiments.

FIG. 1 is a schematic cross-sectional structural diagram of a LiDAR heat dissipation structure according to an embodiment of the present utility model.

In the FIGURE: 1. cold plate; 2. heat pipe; 3. graphite layer; 4. thermally conductive structural adhesive; 5. mainboard; 6. chip; 7. thermally conductive interface material layer; and 8. housing.

DETAILED DESCRIPTION OF EMBODIMENTS

In order to illustrate the objectives, technical solutions and advantages of the present utility model more clearly, the present utility model will be further described in detail below in conjunction with the embodiments and with reference to the accompanying drawings. It should be understood that these descriptions are exemplary, and not intended to limit the scope of the present utility model. Moreover, in the following illustration, the description of well-known structures and techniques are omitted to avoid unnecessarily obscuring the concept of the present utility model.

As shown in FIG. 1, in a LiDAR heat dissipation structure according to an embodiment, the LiDAR comprises a mainboard 5, a chip 6, a housing 8, and other components, for example, functional components such as laser and rotating mirror, wherein the mainboard 5, the chip 6 and the functional components such as laser and rotating mirror are provided in the housing 8 in a sealed manner, the housing 8 has a U-shaped structure, the chip 6 is provided on the mainboard 5, the mainboard 5 is an existing conventional PCB, and a plurality of chips 6 may be provided. In FIG. 1 of the present embodiment, one chip 6 is shown as an example. The heat dissipation structure comprises a cold plate 1 and a heat pipe 2. The cold plate 1 is in the shape of a square plate and couples with the housing 8 to form a sealed cavity in which the mainboard 5 and the functional components such as laser and rotating mirror are sealed, with the inner surface of the cold plate 1, i.e., the lower surface of the cold plate 1 as shown in FIG. 1, being provided with a temperature equalization structure layer attached thereon, and the outer surface facing away from the chip 6, i.e., the upper surface of the cold plate 1 as shown in FIG. 1, being provided with a plurality of heat dissipation fins or heat dissipation slots formed thereon. Specifically, the heat pipe 2 is an elongated sheet-like heat pipe 2 extending along the longitudinal direction of the cold plate 1, i.e., the left-right direction as shown in FIG. 1, and is fixedly embedded in the cold plate 1 through a thermally conductive structural adhesive 4. The inner surface of the cold plate 1 is provided with the temperature equalization structure layer attached thereon, thereby solving the problem of regional heat concentration of electronic components inside the LiDAR and achieving the temperature uniformity in a large area. It also solves the problem of process complexity and high cost in the prior art wherein the interior of the cold plate 1 is made into a vacuum cavity and the temperature equalization is achieved by gas-liquid phase transition. By providing the heat pipe 2 inside the cold plate 1, the problem of overheat at a certain point of the electronic components inside the LiDAR is resolved, and the heat of the overheat point is quickly transferred to the cooler and less temperature-sensitive region on the LiDAR. It also solves the problem of high cost, reliability and additional heat in the existing method wherein the heat dissipation is achieved by the TEC semiconductor and the air-cooling heat dissipation device. In addition, the heat pipe 2 is fixedly embedded by the thermally conductive structural adhesive 4, where not only the heat pipe 2 is fixed, but also the contact thermal resistance is reduced. Compared with the conventional method of tin soldering or interference fit, it has simpler process and lower cost. The disadvantage of tin soldering is that the local electroplating of the cold plate 1 is difficult and the corrosion resistance is poor. The disadvantage of interference fit is that the heat pipe 2 is exposed to the outside and a thicker bottom housing is required.

In order to allow the heat pipe 2 to be fixedly embedded in the cold plate 1, an inwardly recessed embedded portion is provided on a side surface of the cold plate 1 and the heat pipe 2 is fixed by the embedded portion, wherein the outer side of the heat pipe 2 does not exceed the opening of the embedded portion, thereby solving the problem in the prior art that the heat pipe 2 is exposed to the outside due to the interference fit. Specifically, as shown in FIG. 1, the embedded portion is an inwardly recessed groove, provided in the side wall of the cold plate 1, extending along the longitudinal direction of the cold plate 1, i.e., the left-right direction as shown in FIG. 1, with the depth of the groove not greater than, i.e., less than or equal to, the thickness of the side wall of the cold plate 1. In the present embodiment, the depth of the groove is preferably less than the thickness of the side wall of the cold plate 1, i.e., the heat pipe 2 is a thin heat pipe 2 with a relatively small thickness. The thickness of the heat pipe 2 is not described and defined in detail, and the heat pipe 2 can be the thin heat pipe 2 available in the market with a relatively small thickness known to those skilled in the art. The depth of the groove can also be small, and accordingly the thickness of the cold plate 1 does not need to be designed to be very thick, which solves the problem that the bottom housing is thick due to the interference fit in the prior art. In a preferable embodiment, in order to protect the heat pipe 2, a cover plate is provided on the outer surface of the heat pipe 2, i.e., at the opening of the groove, for covering the heat pipe 2. In an alternative embodiment, the groove is provided on the inner surface or the outer surface of the cold plate 1 instead of the side wall of the cold plate 1. In the present embodiment, there is a gap between an inner wall of the groove and the heat pipe 2 and the gap is to facilitate the filling of the thermally conductive structural adhesive 4, which is used to make the heat pipe 2 fixedly embedded in the groove.

With regard to the temperature equalization structure layer, a graphite layer 3 is used in the present embodiment. The graphite layer 3 may be formed by stacking multiple layers of graphite sheets, such as graphite paper or graphite heat dissipation sinks common in the prior art, in a vertical direction as shown in FIG. 1. The graphite layer 3 can be designed in various shapes, which are not described and defined in detail and can be selected and designed by those skilled in the art according to actual needs.

The specific performance parameters of the thermally conductive structural adhesive 4 in the present embodiment are not described and defined in detail, and the thermally conductive structural adhesive 4 can be the common thermally conductive structural adhesive 4 available in the existing market and can be selected by those skilled in the art according to actual needs.

Since the LiDAR is installed in a closed space and the housing cannot be in direct contact with the natural air, in order to realize that the heat transferred from the inside of the LiDAR to the housing can be smoothly transferred to the atmosphere, the material of the housing in the present embodiment is designed to be made of semi-solid die-cast aluminum alloy whose thermal conductivity is above 160 W/(m K), which is better than that of ordinary die-cast aluminum alloy (96.2 W/(m K)), and can effectively improve the natural heat dissipation capacity.

In the present embodiment, the chip 6 is connected to the inner surface of the cold plate 1 via a thermally conductive interface material layer 7, and similarly, other components requiring heat dissipation or heat generating components (not shown in the FIGURE) are also connected to the cold plate 1 via the thermally conductive interface material layer 7, and heat is transferred to the cold plate 1 via the thermally conductive interface material layer 7 for heat dissipation. The thermally conductive interface material layer 7 is a conventional thermally conductive interface material available in the existing market, such as a thermally conductive silicone sheet and the specific performance parameters thereof are not described and defined in detail and can be selected by those skilled in the art according to implementation requirements.

The embodiment of the present utility model further provides a LiDAR comprising the LiDAR heat dissipation structure of the embodiment described above. Since the LiDAR heat dissipation structure of the embodiment described above is adopted, the LiDAR has at least the advantages of the LiDAR heat dissipation structure of the embodiment described above.

It should be understood that the detailed description of the embodiments of the present utility model are merely used to illustrate or explain the principle of the present utility model and are not construed as limiting the present utility model. Therefore, any modifications, equivalent substitutions, improvements, etc. without departing from the spirit and scope of the present utility model should be included within the scope of protection of the present utility model. In addition, the appended claims of the present utility model are intended to cover all the variations and modifications that fall within the scope and boundary of the appended claims or equivalents of the scope and boundary.

What is claimed is:

1. A heat dissipation structure for a light detection and ranging (LiDAR) system, wherein the LiDAR system comprises a mainboard, a chip, and a housing, and the chip is provided on the mainboard, the heat dissipation structure comprising:

- a cold plate, wherein an inner surface of the cold plate is provided with a temperature equalization structure layer attached thereon, and an outer surface of the cold plate facing away from the chip is provided with a plurality of heat dissipation fins or heat dissipation slots formed thereon; and
- a heat pipe fixedly embedded in the cold plate through a thermally conductive structural adhesive, wherein:
  - a recessed embedded portion is provided on a side surface of the cold plate,
  - a gap is formed between an inner wall of the recessed embedded portion and the heat pipe,
  - the gap is fillable with the thermally conductive structural adhesive, and
  - the cold plate couples with the housing to form a sealed cavity in which the mainboard and the chip are provided.

2. The heat dissipation structure according to claim 1, wherein:

- the recessed embedded portion is a groove extending along a longitudinal direction of the cold plate, and
- a depth of the groove is no greater than a thickness of a side wall of the cold plate.

3. The heat dissipation structure according to claim 1, wherein a cover plate is provided at an opening of the recessed embedded portion for covering the heat pipe.

4. The heat dissipation structure according to claim 1, wherein the temperature equalization structure layer is a graphite layer.

5. The heat dissipation structure according to claim 4, wherein the graphite layer is formed by stacking multiple layers of graphite sheets.

6. The heat dissipation structure according to claim 1, wherein the housing is made of semi-solid die-cast aluminum alloy.

7. The heat dissipation structure according to claim 1, wherein a thermally conductive interface material layer is provided between the chip and the inner surface of the cold plate.

8. A light detection and ranging (LiDAR) system, comprising:

- a mainboard, a chip, and a housing, and the chip is provided on the mainboard;
- a heat dissipation structure comprising:
- a cold plate, wherein an inner surface of the cold plate is provided with a temperature equalization structure layer attached thereon, and an outer surface of the cold plate facing away from the chip is provided with a plurality of heat dissipation fins or heat dissipation slots formed thereon; and
- a heat pipe fixedly embedded in the cold plate through a thermally conductive structural adhesive, wherein:
  - a recessed embedded portion is provided on a side surface of the cold plate, a gap is formed between an inner wall of the recessed embedded portion and the heat pipe,
  - the gap is fillable with the thermally conductive structural adhesive, and
  - the cold plate couples with the housing to form a sealed cavity in which the mainboard and the chip are provided.

9. The LiDAR system according to claim 8, wherein:

- the recessed embedded portion is a groove extending along a longitudinal direction of the cold plate, and
- a depth of the groove is no greater than a thickness of a side wall of the cold plate.

10. The LiDAR system according to claim 8, wherein a cover plate is provided at an opening of the recessed embedded portion for covering the heat pipe.

11. The LiDAR system according to claim 8, wherein the temperature equalization structure layer is a graphite layer.

12. The LiDAR system according to claim 11, wherein the graphite layer is formed by stacking multiple layers of graphite sheets.

13. The LiDAR system according to claim 8, wherein the housing is made of semi-solid die-cast aluminum alloy.

14. The LiDAR system according to claim 8, wherein a thermally conductive interface material layer is provided between the chip and the inner surface of the cold plate.

* * * * *